United States Patent [19]

Lunden

[11] Patent Number: 4,634,963
[45] Date of Patent: Jan. 6, 1987

[54] METHOD AND APPARATUS FOR THE TESTING OF DIELECTRIC MATERIALS

[75] Inventor: Clarence D. Lunden, Federal Way, Wash.

[73] Assignee: The Boeing Company, Seattle, Wash.

[21] Appl. No.: 534,210

[22] Filed: Sep. 21, 1983

[51] Int. Cl.⁴ ............................................. G01R 27/04
[52] U.S. Cl. .............................. 324/58 A; 324/58.5 A
[58] Field of Search ...................... 324/58.5 A, 58.5 R, 324/58 R, 58 A, 95, 316, 317

[56] References Cited

U.S. PATENT DOCUMENTS

| | | | |
|---|---|---|---|
| 2,457,695 | 12/1948 | Liskow | 26/70 |
| 2,463,297 | 3/1949 | Muskat et al. | 175/183 |
| 2,797,388 | 6/1957 | Maybury et al. | 324/58.5 |
| 3,034,046 | 5/1962 | Sasaki | 324/58.5 |
| 3,046,478 | 7/1962 | Dawson | 324/58 |
| 3,525,934 | 8/1970 | Prine et al. | 324/58.5 |
| 3,534,260 | 10/1970 | Walker | 324/58.5 |
| 3,622,874 | 11/1971 | Chasek | 324/58.5 A |
| 3,694,737 | 9/1972 | Busker et al. | 324/58.5 A |
| 3,818,333 | 6/1974 | Walker | 324/58.5 A |
| 4,075,555 | 2/1978 | Wight et al. | 324/58.5 R |
| 4,123,702 | 10/1978 | Kinanen et al. | 324/58.5 A |
| 4,135,131 | 1/1979 | Larsen et al. | 324/58.5 A |
| 4,211,970 | 7/1980 | Fitzky et al. | 324/58.5 C |
| 4,247,815 | 1/1981 | Larsen et al. | 324/58.5 A |
| 4,274,048 | 6/1981 | Tricoles et al. | 324/58 R |

FOREIGN PATENT DOCUMENTS

| | | | |
|---|---|---|---|
| 392399 | 12/1973 | U.S.S.R. | 252/324 |
| 444052 | 5/1975 | U.S.S.R. | 252/324 |

OTHER PUBLICATIONS

Nowicki, Thomas E., "Microwave Substrates Present and Future" 10/79, pp. 26-1—26-12.

Primary Examiner—Reinhard J. Eisenzopf
Assistant Examiner—Jack B. Harvey
Attorney, Agent, or Firm—Christensen, O'Connor, Johnson & Kindness

[57] ABSTRACT

Method and apparatus for the nondestructive testing of metal-clad microwave circuit boards to determine dielectric constant variations within the dielectric sheets of such boards. The method involves using injected microwave energy to measure values related to the average dielectric constant along a plurality of paths in the plane of the sheet. The paths are divided into two intersecting groups, with each path being parallel to the members of its own group. Resulting values are then compared in order to identify dielectric constant variations within the sheet. Measurements may be made by means of phase delay or amplitude/resonance frequency techniques. A preferred apparatus for phase delay measurement is disclosed which includes means for making a simultaneous phase delay measurement along a reference air path.

27 Claims, 18 Drawing Figures

METHOD AND APPARATUS FOR THE TESTING OF DIELECTRIC MATERIALS

FIELD OF THE INVENTION

The present invention relates to methods and apparatus for the testing of microwave circuit boards and, in particular, to methods for determining the uniformity of the dielectric constant throughout such boards.

BACKGROUND OF THE INVENTION

Microwave circuit boards consist of thin sheets of dielectric material sandwiched between two layers of copper or other metal. The thickness of the dielectric sheets is typically in the range of 0.01–0.3 inches. The boards are used for a variety of applications involving the transmission of microwave signals. The copper layers on one or both sides of the board may be etched into intricate shapes as required by a particular application.

Unlike more common low frequency circuit boards, microwave circuit boards must employ a low loss dielectric material to prevent unwanted heating and dissipation of energy. Further, and of particular importance to the present invention, the speed at which microwave energy propagates through the boards depends on the dielectric constant of the dielectric sheets. Testing and control of the dielectric constant of such sheets is, therefore, critical to reliable circuit design. The use of routine testing methods is precluded, however, by the fact that the sheets are sandwiched between copper layers that block the transmission of microwave energy.

Prior methods for testing the dielectric constant of microwave circuit boards include low frequency capacitance measurements, pull-tab methods and ultrasonic methods. Capacitance measurements simply yield board-wide averages, and provide no information concerning variations within a board. A localized anomaly in dielectric constant will therefore go undetected using a capacitance technique. In the pull-tab method, copper is removed from a small section of the board, and the underlying substrate is tested using a dipole-resonant frequency technique. Unfortunately, this method destroys the board under test, and also fails to sample the entire board. Ultrasonic sounding is capable of finding local delaminations and of determining the relationship between dielectric constant and density. However, it has not yet been perfected to the point where it can reliably be used for the direct measurement of dielectric constant.

SUMMARY OF THE INVENTION

The present invention provides a method and apparatus for the nondestructive testing of metal-clad microwave circuit boards such that dielectric constant variations within the dielectric sheets of such boards may be identified. The method involves injecting microwave energy along each of a plurality of paths in the plane of the sheet so as to determine values related to the average dielectric constants for the portions of the sheet defined by such paths. The paths are divided into two intersecting groups, with each path being parallel to members of its own group. The resulting values are then compared in order to identify dielectric constant variations within the sheet.

In one embodiment, the phase delay along each path is determined by means of microwave energy travelling along the path. The microwave energy is injected edgewise into the board at one end of the path, and the phase of the injected wave is compared to the phase of the wave emerging at the opposite end. A simultaneous measurement may be made along a known air path to provide a reference. Once the phase delay is known, it may be converted into a value for the average dielectric constant for the path.

In a second embodiment, the transmission or attenuation of microwave energy is measured along each path. The frequency of the injected energy is varied until a resonance frequency is found, and the resonance frequency is used to calculate the average dielectric constant along the respective path.

BRIEF DESCRIPTION OF THE DRAWINGS

FIGS. 9a–h is a chart illustrating methods for analyzing the measurements made in accordance with the present invention.

DETAILED DESCRIPTION OF THE INVENTION

Figure 1:
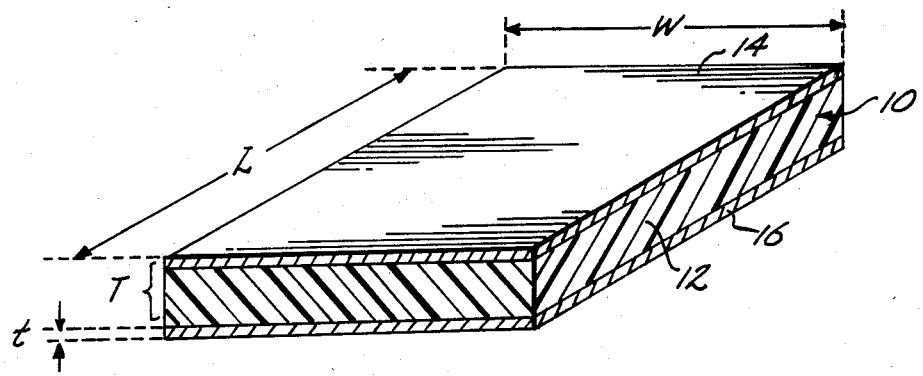
FIG. 1 is a perspective view of a microwave circuit board.

FIG. 1 illustrates a rectangular microwave circuit board 10 which may be tested by means of the present invention. Board 10 has a rectangular shape of dimensions L×W and consists of a sheet 12 of dielectric material that has been clad with thin layers 14, 16 of copper or other conducting material. The copper cladding 14, 16 completely covers the top and bottom of sheet 12, leaving it exposed only along the edges of the board. Sheet 12 has thickness T that typically is in the range of 0.01–0.3 inches. The thickness T has been exaggerated in FIG. 1, and is typically smaller than dimensions L and W by an order of magnitude or more. The copper cladding layers 14, 16 typically have thicknesses in the range 0.0007–0.0027 inches.

For practical microwave applications, dielectric sheet 12 must consist of a low loss, environmentally stable substrate. A common material is fiberglass impregnated with a polytetrafluoroethylene resin, which has a dielectric constant of about 2.5. The techniques of the present invention are, however, not limited to any particular substrate.

Figure 2:
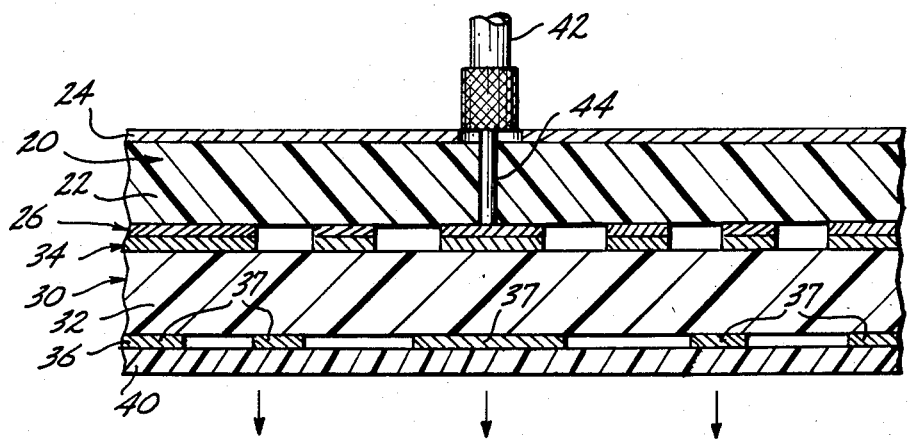
FIG. 2 is a partial cross-sectional view of an antenna constructed from two microwave circuit boards.

FIG. 2 illustrates the use of microwave circuit boards in the construction of a microwave antenna. The antenna, shown in partial cross section, consists of microwave circuit boards 20 and 30 and radome 40 stacked together in a generally parallel fashion. The direction of radiation from the antenna is indicated by the arrows. Microwave energy is fed to the antenna through a coaxial cable 42 which includes a central conducting element 44. Microwave circuit board 20 consists of dielectric sheet 22 and copper cladding layers 24, 26. Similarly, board 30 consists of dielectric sheet 32 and copper layers 34, 36. Randome 40 is typically an inert plastic material whose function is insulation.

Copper layer 36 of board 30 is etched in a manner dictated by the desired radiation pattern. The copper elements remaining in layer 36 after the etching process are indicated by numeral 37. Microwave energy injected via conducting element 44 travels through microwave circuit boards 20 and 30 to elements 37, and then is radiated into space. The manner in which power from element 44 is divided among elements 37 is controlled by the etching patterns on facing copper layers 26 and 34. These layers are commonly etched in matching and aligned patterns, as indicated in FIG. 2.

An important factor in antenna design is the phase delay experienced by the microwave energy in traveling from conducting element 44 to radiating elements 37. When the wavelength of the radiation is greater than the thickness of boards 20 and 30 (TEM propagation, with the electric field perpendicular to the plane of the board), the phase velocity through the dielectric sheet is given by:

$$v = c/\sqrt{e} \tag{1}$$

where c is the velocity of light in a vacuum, and e is the dielectric constant of sheets 22 and 32. It is therefore apparent that unknown variations in dielectric constant can have a significant impact on antenna circuit design. While knowledge of the average dielectric constant for a board is of some value, it does not help the engineer deal with the problem of local anomalies, which, for example, could cause one of the elements 37 to be out of phase, seriously detracting from antenna performance. The present invention provides an efficient method for detecting such anomalies, before the cost of etching the copper layers has been incurred. Boards that do not meet design tolerances can then be rejected or used for less critical applications.

Figure 3:
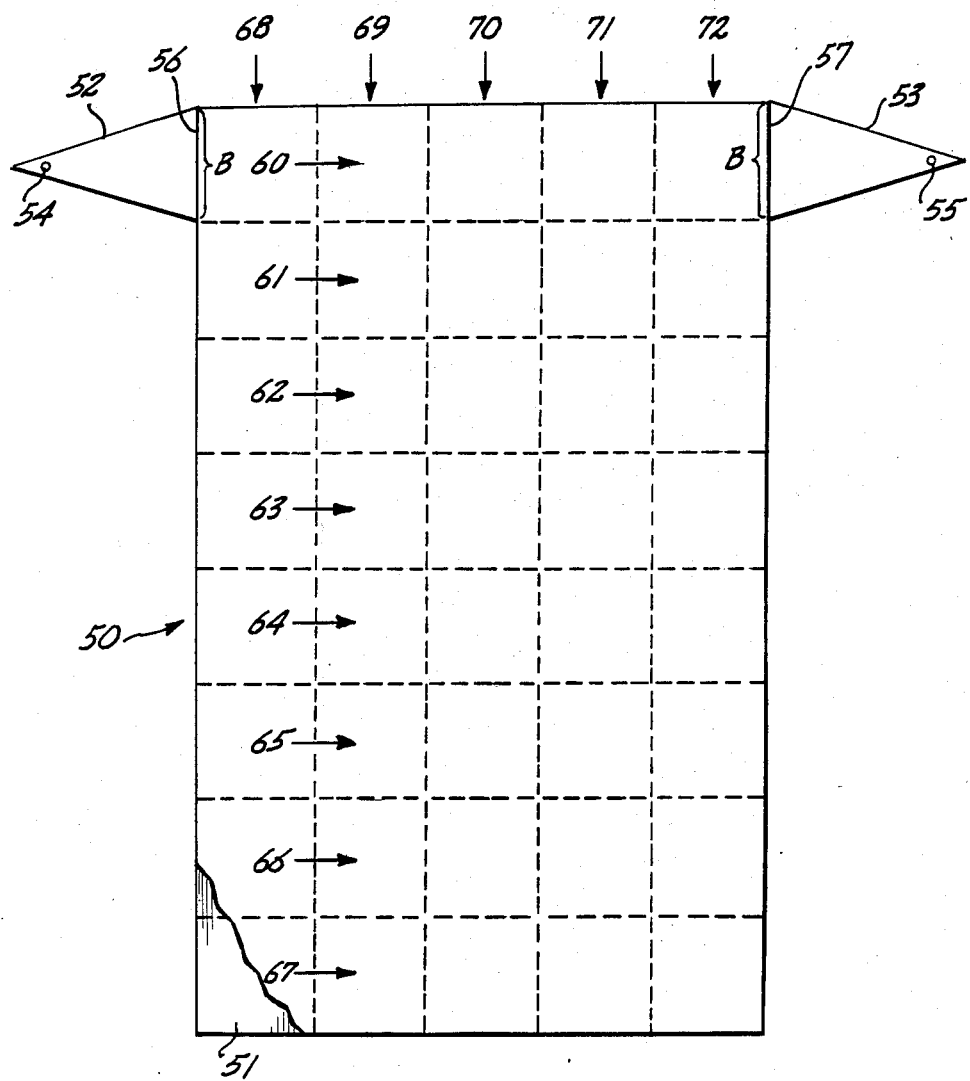
FIG. 3 is a schematic view illustrating a method for testing microwave circuit boards according to the present invention.

FIG. 3 depicts in schematic form the testing of microwave circuit board 50 according to the present invention. Board 50 is similar to board 10 shown in FIG. 1, and includes a dielectric sheet 51 indicated in the cutaway portion of FIG. 3. The method of the present invention comprises measuring values related to the mean dielectric constant along paths 60–67 and 68–72 through sheet 51. The measurements are made by means of microwave energy injected along the paths by transmitting horn 52, which energy is detected by receiving horn 53. Transmitting horn 52 is illustrated schematically as including a feed element 54 and exit aperture 56. Similarly, receiving horn 53 includes entrance aperture 57 and pickup element 55. Details of a preferred horn construction are described more fully below.

In FIG. 3, transmitting horn 52 is positioned such that it is capable of injecting a beam of microwave energy edgewise into dielectric layer 51 of board 50 along path 60, with an effective aperture or beam width B. Receiving horn 53 is positioned in alignment with transmitting horn 52, such that it is capable of receiving microwave energy traveling along path 60 with an effective entrance aperture also equal to B. The distance at which the divergence of radiation from aperture 56 begins to become significant is given by:

$$D = \frac{B^2 \sqrt{e}}{\lambda} \tag{2}$$

where B is the width of aperture 56, $\lambda$ is the wavelength of the radiation, and e is the dielectric constant of sheet 51. Negligible beam divergence can be achieved by proper selection of these parameters. Thus, for a board 18 inches wide having a dielectric constant of about 2.5, one might choose B=3 inches, $\lambda=\frac{2}{3}$ inches (18 gHz), giving a value for D of about 21 inches. The wavelength of the radiation is also selected so that the principal mode of propagation is TEM. Under such circumstances, equation 1 holds, and there is a known relationship between dielectric constant and wave velocity. To assure that the TEM mode predominates, the wavelength should be greater than the thickness of sheet 51 and preferably greater than twice such thickness. For purposes of the present invention, it is assumed that knowledge of the wave velocity through a material is equivalent to knowledge of the dielectric constant of that material.

After the mean dielectric constant or other appropriate value has been measured for path 60, horns 52, 53 and/or board 50 are repositioned such that path 61 is aligned between the horns, and a similar measurement is made. This process is repeated for paths 62–67. Board 50 is then rotated 90° with respect to the horns, and the process is continued for paths 68–72. The accumulated values for rows 60–67 and columns 68–72 are then compared with one another, and the amount of variability is determined. Particular comparison methods are discussed below. It is to be understood that the use of eight rows and five columns in FIG. 3 is for illustration only, and that in general the number of rows and columns will depend upon the precision required in a particular application. For paths immediately adjacent the edges of the board (e.g., paths 60, 67, 68 and 72), it will at times be preferable to cover such edges with energy absorbing means (not shown) to prevent unwanted reflections.

Although not a requirement of the present invention, the use of a series of side by side paths of equal width will usually be preferred. If there are gaps between paths, then there will be a chance of missing an area containing an anomaly. Overlapping paths may be used, but they require more effort and are generally unnecessary. If the board dimensions are not integer multiples of the aperture width B, then some small overlap will be needed to fully scan the board. Paths may vary in width, but constant width paths are more convenient since they permit scanning of an entire board with a single pair of horns.

Figure 4:
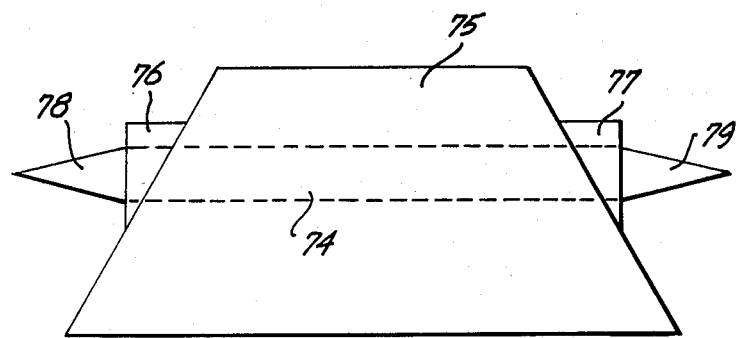
FIG. 4 is a schematic view illustrating the testing of a nonrectangular microwave circuit board according to the method of the present invention.
Figure 5:
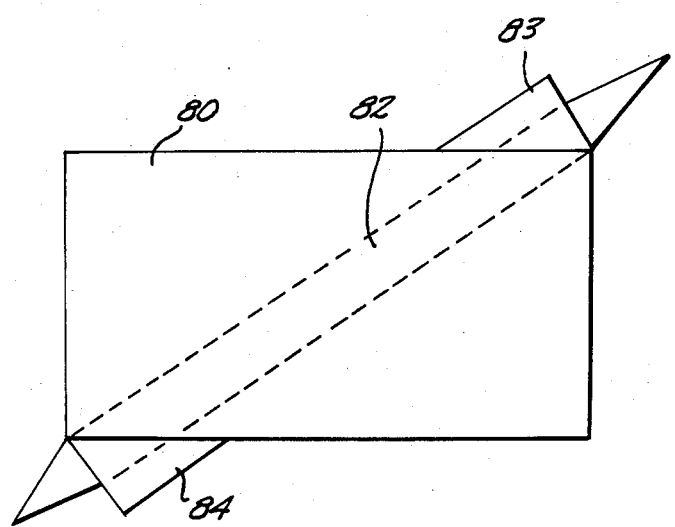
FIG. 5 is a schematic view illustrating the use of diagonal paths for testing microwave circuit boards in accordance with the present invention.

FIG. 4 illustrates the testing of a nonrectangular microwave circuit board 75 according to the method of the present invention. Microwave energy is injected from transmitting horn 78 to receiving horn 79 along path 74 via a pair of adapter prisms 76 and 77, respectively. The prisms are generally constructed of microwave circuit board material having a thickness and dielectric constant as close as possible to board 75, so that reflections at the interfaces between the adapters and the board are minimized. As illustrated in FIG. 5, adapter prisms may also be used to probe boards along nonperpendicular paths. In FIG. 5, board 80 is tested along diagonal path 82 using prisms 83 and 84. Diagonal path testing may be especially suitable in cases where it is suspected that anomalies may be in the form of diagonal ridges.

Figure 6:
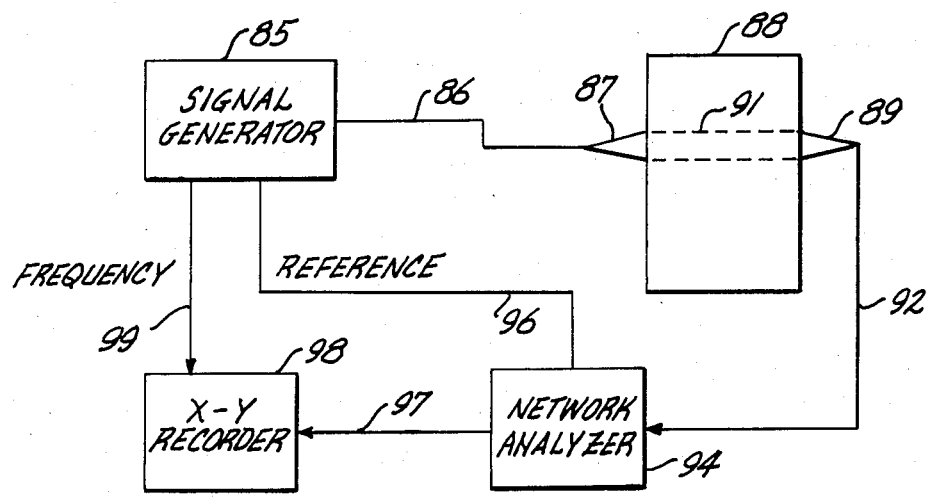
FIG. 6 is a block diagram of an apparatus for testing microwave circuit boards by means of phase delay measurements.

A testing apparatus according to one embodiment of the present invention is shown in FIG. 6. In this embodiment, signal generator 85 produces a single frequency microwave signal 86 that is routed into transmitting horn 87. The microwave energy passes from horn 87 through the dielectric sheet of microwave circuit board 88 along path 91, into receiving horn 89, and the resulting transmitted signal 92 is cabled to network analyzer 94. Network analyzer 94 also receives a reference signal 96 directly from signal generator 85. By comparison of the reference signal 96 and transmitted signal 92, the phase delay of the microwave energy through the board is determined. This phase delay may be displayed directly to an operator. Alternatively, signal generator 85 may be swept in frequency, and a graph of phase delay as a function of frequency may be produced on X-Y recorder 98. Recorder 98 receives its phase delay signal 97 from network analyzer 94, and its frequency signal 99 from signal generator 85.

Network analyzer 94 computes phase delay by determining the phase difference between signal 92 and reference signal 96. To avoid error due to the transit time of signals 86, 92 and 96, the phase delay is determined with reference to the delay measured with board 88 removed and horns 87 and 89 brought together so that their apertures tightly abut. The additional delay measured with board 88 in place is thus due to the phase delay through the board. This delay is related to the dielectric constant of the substrate of board 88 as follows:

$$\phi = \frac{2\pi}{\lambda} \sqrt{e_{av}} L \tag{3}$$

where $\phi$ is the phase delay, $\lambda$ is the wavelength of the radiation, L is the length of path 91, and $e_{av}$ is the average dielectric constant along path 91. Thus the average dielectric constant can readily be calculated once the phase delay is known.

Figure 7:
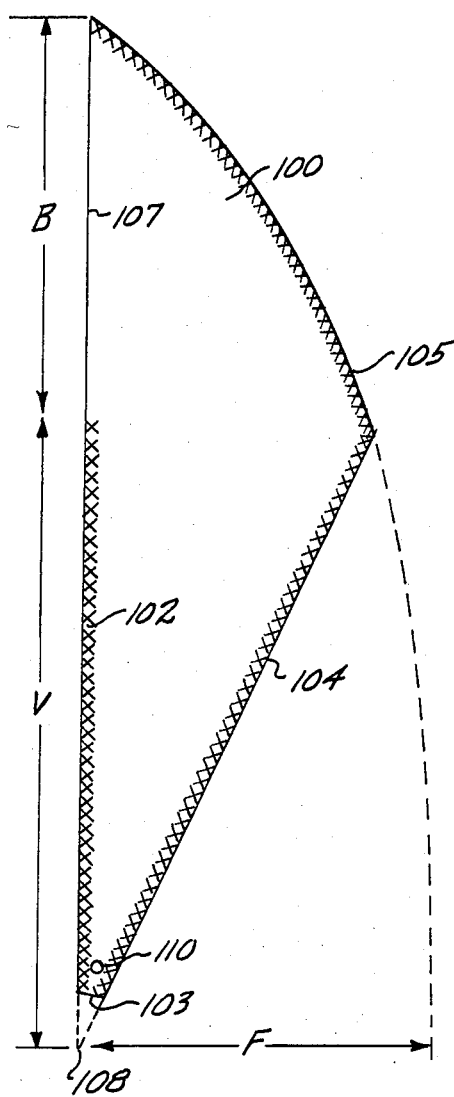
FIG. 7 is an elevational view of a microwave horn for use in carrying out the present invention.

In the embodiment shown in FIG. 6, in which dielectric constant is determined from phase delay, it is desirable to minimize the amount of reflection taking place at the interface between the horns and the board. Referring to FIG. 7, a preferred construction of the transmitting and receiving horns for phase delay measurement is shown. Horn 100 comprises a section of metal-clad microwave circuit board having a thickness and dielectric constant as close as possible to those of the board to be tested. The shape of the horn is defined by linear edges 102, 103 and 104 and parabolic edge 105. Edges 103, 104 and 105, and a portion of edge 102 are covered with copper tape, as indicated by crosshatch in FIG. 7. The portion of edge 102 which is not covered with copper tape constitutes aperture 107. Microwave energy is cabled to or from the horn through tap point 110. The shape of parabolic edge 105 is defined by a parabola having a focal length of F and a prime focus at the apex 108 formed by extending edges 102 and 104. With this geometry, radiation introduced at tap point 110 will arrive at aperture 107 with a flat phase front. Similarly, radiation entering aperture 107 will be focused at tap 110 without phase distortion. Preferred dimensions for horn 100 are:

$3\lambda < B < 5\lambda$
$V = 2B$
$F = B$ where $\lambda$ is the wavelength of the radiation.

Figure 8:
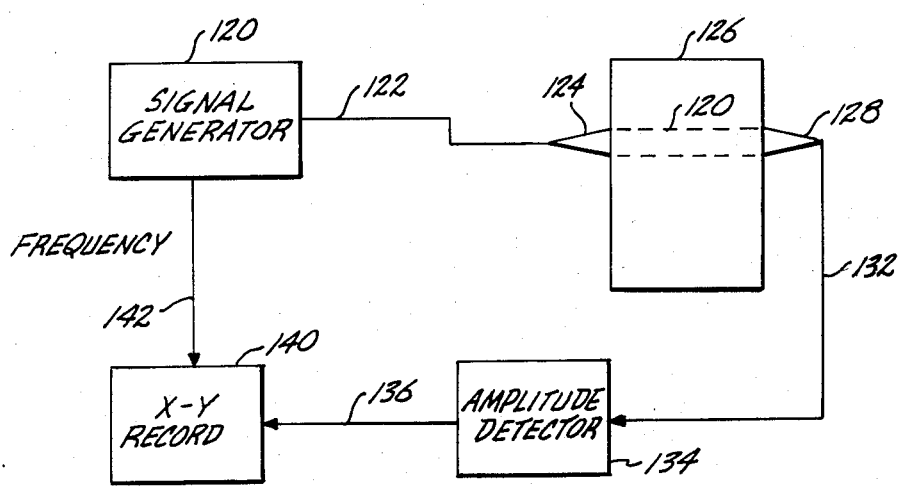
FIG. 8 is a block diagram of an apparatus for testing microwave circuit boards by means of attenuation measurements.

A second preferred method of carrying out the present invention is illustrated in block diagram form in FIG. 8. In this embodiment, signal generator 120 produces a single frequency microwave signal 122 that is cabled into transmitting horn 124. The microwave energy passes from horn 124 through the dielectric sheet of microwave circuit board 126 along path 120, into receiving horn 128, and the transmitted signal 132 is routed to amplitude detector 134. The amplitude detector sends a signal 136 to X-Y recorder 140 indicative of the amplitude of the microwave signal transmitted through board 126. X-Y recorder 140 also receives a frequency signal 142 from signal generator 120. The frequency of the signal produced by signal generator 120 is varied continuously within a range of frequencies, and the resulting amplitude vs. frequency graph is recorded on the X-Y recorder.

The method shown in FIG. 8 depends upon the creation of resonance or of standing waves of microwave energy within board 126. To produce such resonance, it is preferable that there be wave reflection at the horn/board interfaces. As is well known, such reflection can easily be achieved by mismatching the dielectric constant of the horns and board, and/or by using horns whose thickness does not match that of the dielectric layer within the board being tested. For this reason, the method shown in FIG. 8 is preferred for very thin boards, e.g., less than 0.1 inches, because of the difficulty in matching horns to such boards.

The output of X-Y recorder 140 will consist of a series of amplitude peaks corresponding to different resonances. For thin boards in which the thickness T of the dielectric layer satisfies $T << L\sqrt{e}$ where L is the length of path 120 through the board, the resonance peaks are described by $$f_n = \frac{nc}{2L\sqrt{e_{av}}} \tag{4}$$

where $f_n$ is the resonance frequency, c is the velocity of light in a vacuum, L is the length of path 120, $e_{av}$ is the average dielectric constant along path 120, and n is a positive integer. Since successive frequency peaks will correspond to successive values for n, the dielectric constant can be determined from $$\sqrt{e_{av}} = \frac{c}{2L \Delta f} \tag{5}$$

where $\Delta f$ is the peak spacing. More precise calculations can be made by repeating the amplitude versus frequency measurements for ranges of frequencies, which are whole multiples or divisions of the initial range, and thereby determining the exact resonance order of each frequency peak. For example, if a given peak had been tentatively identified as corresponding to resonance number 27, and if the frequency of such peak was 12.63 gHz, then one would expect to find the ninth resonance at f/3 or 4.21 gHz. Failure to do so would suggest that 12.63 gHz corresponds to n=26 or n=28, and further checking at f/4 could select between these two values.

FIGS. 9a-h illustrate different methods of utilizing the data obtained through the present invention. Referring first to FIG. 9a, a microwave circuit board having a nominal dielectric constant of 3.0 has been scanned along six paths consisting of three rows and three columns. The boundaries between adjacent paths are indicated by the dashed lines. The resulting values obtained for the average dielectric constants are indicated by the numbers written outside the board adjacent to the respective rows and columns. The numbers written within the board indicate the actual (unknown) variations of dielectric constant giving rise to the measured average values. As indicated, the center of the board in FIG. 9a contains an isolated peak of anomalously high dielectric constant. The size of the anomaly is 10% of the nominal value for the board, a size that would make the board unsuitable for many applications. However, conventional testing techniques using a board-wide average would yield a value of 3.03, a variation within the tolerances provided for many commercial boards. A simple inspection of the row and column averages produced by the present invention, however, reveals the presence of a serious problem with the board.

FIG. 9b shows, in a format similar to that of FIG. 9a, a microwave circuit board in which the anomaly consists of a vertical ridge of high dielectric constant, the anomaly again being 10% of the nominal value for the board. As in the case of FIG. 9a, the techniques of the present invention provide considerably more information about the suitability of the board for a given application.

Three rows and three columns have been used in the above examples for purposes of simplicity of illustration. In most instances, measurements of mean dielectric constant will be made over a greater number of paths, and more systematic methods for numerical processing are therefore desirable. In one preferred method, the dielectric constant for a particular subsection of the board is calculated by taking the arithmetic average of the row and column measurements corresponding to the subsection. Symbolically, if $e_{ij}$ is the estimated dielectric constant for the subsection consisting of the intersection of row i and column j, then $$e_{ij} = \frac{R_i + C_j}{2} \quad (6)$$

where $R_i$ is the measured average dielectric constant for row i, and $C_j$ is the corresponding quantity for column j. Application of this formula to the values shown in FIGS. 9a and 9b yields, respectively, the dielectric constant estimates shown in FIGS. 9c and 9d. In both cases, the shape of the anomaly has been accurately portrayed.

If it is believed that an anomaly consists of a single peak, then an improved method of estimation is:

$$e_{ij} = e_0 + \frac{nR_i + mC_j - (m+n)e_0}{2} \quad (7)$$

where $e_0$ is a nominal or most common value, and where m and n are the number of rows and columns respectively. If $e_0$ is taken to be 3.0 in FIGS. 9a and 9b, then the results of applying this method are shown in FIGS. 9e and 9f, respectively. As may be observed, the magnitude of the anomaly in FIG. 9a has been fully preserved in FIG. 9e.

A third method of data handling is based on a cross-product or geometric average technique, and is represented by the formula:

$$e_{ij} = \frac{R_i C_j}{e_a} \quad (8)$$

where $e_a$ is the average measured dielectric constant for the entire board. The results of applying this method to the boards of FIGS. 9a and 9b are shown respectively in FIGS. 9g and 9h. This approach completely reproduces the ridge anomaly of FIG. 9b.

Referring now once again to the phase delay method of FIG. 6, the length of path 91 through the board will usually be greater than the effective wavelength of the radiation traveling along the path. In this case, phase delay can be expressed as $$\phi_a = n2\pi + \phi_m \quad (9)$$

where $\phi_a$ is the actual phase delay, $\phi_m$ is the phase delay measured by network analyzer 94, and n is a positive integer. In general n is unknown, and thus there is an ambiguity in the determination of $\phi_a$. This ambiguity may be removed by measuring phase delay at a number of different frequencies, or by measuring it over a continuous range of frequencies using X-Y recorder 98, and comparing the results. In many cases, this can be a time-consuming process, and a technique for simplifying the determination of phase delay is desirable.

Figure 10:
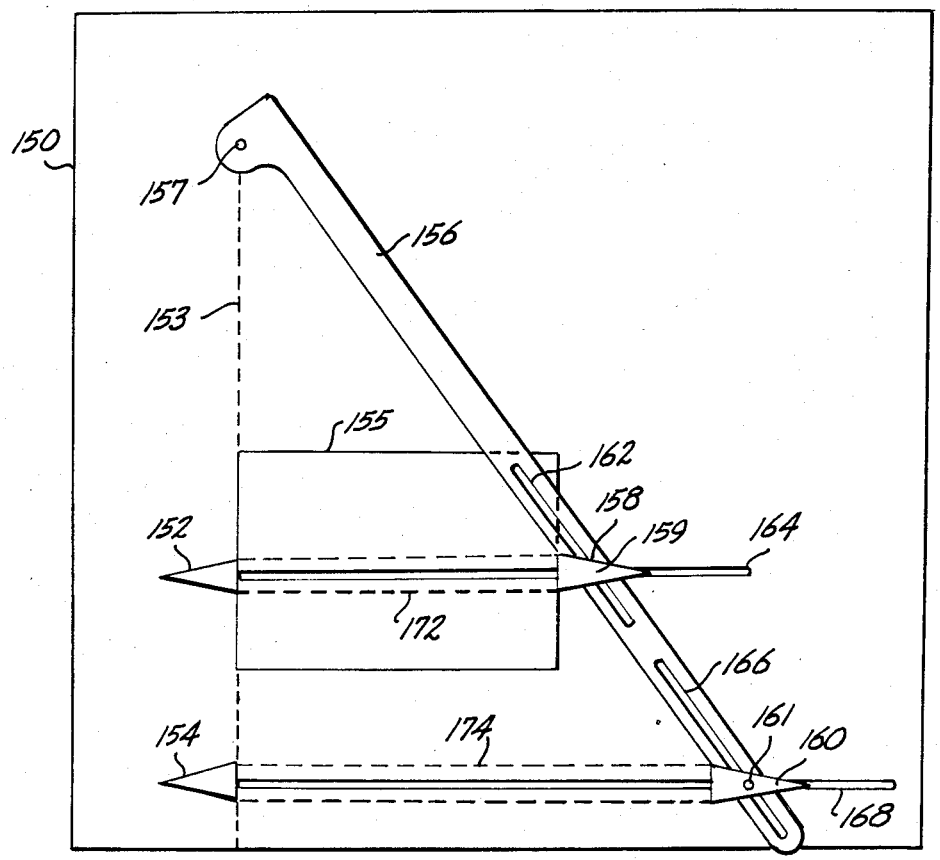
FIG. 10 is an elevational view of an apparatus for testing microwave circuit boards according to the present invention.
Figure 11:
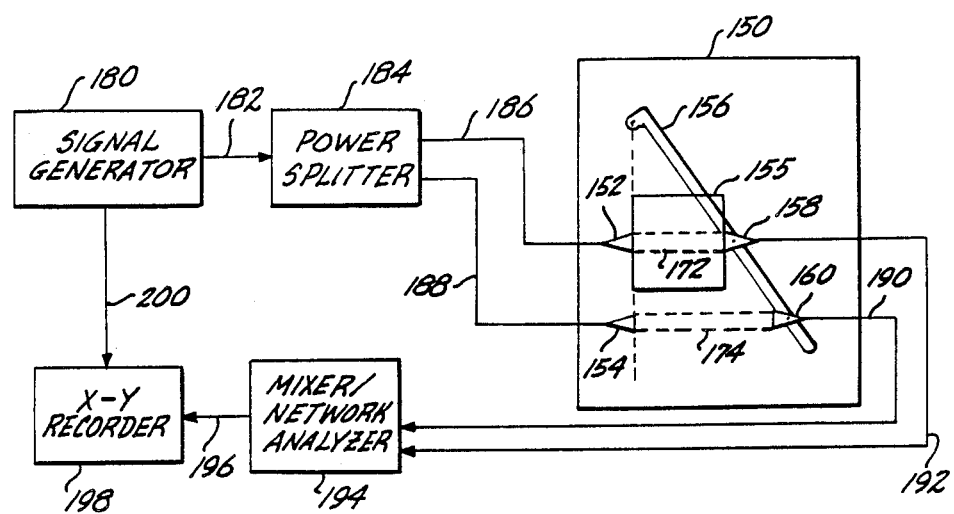
FIG. 11 is a block diagram of an apparatus for testing microwave circuit boards in connection with the apparatus of FIG. 10.

A preferred method and apparatus for making phase delay measurements in accordance with the present invention is illustrated in FIGS. 10 and 11. In this method, two phase delay measurements are made simultaneously; one through the board, and a second through a reference path chosen to produce a known phase delay close to that of the board path. By subtracting the two phase delay measurements, the ambiguity discussed above is eliminated or greatly reduced.

Referring now to FIG. 10, the apparatus comprises a base 150 upon which arm 156 is pivotally mounted by pin 157. Microwave horns 158 and 160 are mounted respectively within slots 164 and 168 by mounting pins 159 and 161, such that the horns are free to move longitudinally along slots 164 and 168, but are not free to rotate. Mounting pins 159 and 161 also pass through slots 162 and 166 respectively in arm 156. Microwave horns 152 and 154 are rigidly mounted to base 150 such that their central axes are aligned with slots 164 and 168, and their apertures are aligned one under the other along line 153.

As a result of the described construction, horns 158 and 160 are constrained to move along parallel paths, defined by slots 164 and 168, and to lie on the line defined by arm 156. As arm 156 is rotated about pivot 157, the board path length 172 between horns 152 and 158 will always be in a fixed ratio to the air path length 174 between horns 154 and 160. Depending on construction details, it may be desirable to raise horns 154 and 160, such that path 174 is never blocked by board 155.

In operation, a microwave circuit board 155 to be tested is inserted between horns 152 and 158, arm 156 is swung leftward so that the horns bear tightly against board 155. Referring now to FIG. 11, a single frequency microwave signal 182 is generated by signal generator 180 and cabled to power splitter 184. The power splitter divides signal 182 into two equal output signals 186 and 188, which signals are cabled to transmitting horns 152 and 154, respectively. The radiation from horn 152 passes through microwave circuit board 155 along path 172 into receiving horn 158, and the radiation from transmitting horn 154 passes along air path 174 into receiving horn 160. The resulting received signals 190 and 192 are then combined in mixer/network analyzer 194. The output of mixer/network analyzer 194 is a signal 196 whose amplitude is proportional to the phase difference between signals 190 and 192. Phase difference signal 196 along with frequency signal 200 are passed to X-Y recorder 198, which records the phase difference as a function of frequency.

Apparatus 150 is constructed such that the fixed ratio of the length of air path 174 to the length of board path 172 is equal to the square root of the nominal or average dielectric constant of board 155. Referring to equation (3), the result will be that the phase delay along paths 172 and 174 will be nearly equal, and the phase difference $\Delta\phi$ measured by signal 196 will be small. Thus, the ambiguity indicated by equation (a) will be eliminated or greatly reduced. Since the phase delay along path 174 is known, the average dielectric constant along path 172 can easily be determined from the measured phase difference $\Delta\phi$. In particular, if subscripts 1 and 2 refer to paths 172 and 174 respectively, and if $L_1$ and $L_2$ are the lengths of paths 172 and 174 measured between the respective horn apertures, then:

$$\Delta\phi = \phi_2 - \phi_1 = \frac{2\pi}{\lambda}(L_2\sqrt{e_2} - L_1\sqrt{e_1}) \qquad (10)$$

$$= \frac{2\pi}{\lambda}(L_2 - L_1\sqrt{e_1})$$

since $e_2 = 1$. For a nominal dielectric constant of 2.56, one would set $L_2 = \sqrt{2.56}\, L_1 = 1.6 L_1$, and obtain:

$$\sqrt{e_1} = 1.6 - \frac{\Delta\phi\lambda}{2\pi L_1} \qquad (11)$$

It will be understood that the invention may be embodied in other specific forms without departing from the spirit or central characteristics thereof. The described embodiments, therefore, are to be considered in all respects as illustrative, and the invention is not to be limited to the details thereof, but may be modified within the scope of the following claims.

The embodiments of the invention in which an exclusive property or privilege is defined are as follows I claim:

1. A method for the nondestructive testing of a sheet of dielectric material having opposite faces conductively surfaced and edges of exposed dielectric, comprising:
   determining, by means of injected microwave energy passed through the dielectric sheet, respective values related to the average dielectric constant of the sheet along a plurality of paths in the plane of the sheet, said paths comprising a first group of mutually parallel paths and a second group of mutually parallel paths oriented to intersect the paths of the first group; and
   comparing said values with one another, thereby identifying variations in dielectric constant within said sheet.

2. The method of claim 1, wherein determining said values comprises measuring the phase delay of microwave energy along the respective paths.

3. The method of claim 1, wherein determining said values comprises measuring the transmission of microwave energy along the respective paths at a plurality of frequencies such that a resonance frequency is identified for each path.

4. The method of claim 1, 2 or 3, wherein the wavelength of said microwave energy is greater than the thickness of said sheet.

5. The method of claim 1, 2 or 3, wherein said microwave energy is injected from a directional beam-forming transmitter successively positioned along an edge of the sheet to define successive paths in a group, said transmitter having an aperture sufficient to create a beam of microwave energy having negligible divergence along the length of the longest path.

6. The method of claim 5, wherein the transmitter is so successively positioned such that the lateral edges of successively adjacent paths in each group approximately coincide.

7. The method of claim 1, 2 or 3, wherein paths in the first group are substantially perpendicular to paths in the second group.

8. The method of claim 2, wherein determining the phase delay along each one of said paths comprises comparing the phase of microwave energy traversing said one path with the phase of a reference signal.

9. The method of claim 8, wherein the reference signal passes through an air path whose length is in a fixed ratio to the length of said one path, said ratio being approximately equal to the square root of the nominal dielectric constant of the sheet.

10. The method of claim 2, wherein the microwave energy is injected into the sheet at one edge by means of a transmitting horn having an aperture whose width defines the width of said paths, and is received from the sheet at a different edge by means of a receiving horn having an aperture oriented to receive the injected microwave energy, said transmitting and receiving horns comprising metal-clad layers of dielectric material having thicknesses substantially equal to the thickness of said sheet.

11. The method of claim 10, wherein the transmitting and receiving horns further comprise parabolic reflector surfaces adapted to minimize phase distortion across the width of their respective apertures.

12. The method of claim 11, wherein the apertures of the transmitting and receiving horns are substantially equal in width, and wherein each of said parabolic reflector surfaces has the shape of an arc of a parabola having a focal length approximately equal to the width of said apertures.

13. The method of claim 12, wherein the width of said apertures is in the range of three times the wavelength of the microwave energy to five times the wavelength of the microwave energy.

14. The method of claim 3, wherein the transmission of microwave energy is measured over a continuous range of frequencies for each path.

15. The method of claim 14, wherein a plurality of resonance frequencies are identified for each path.

16. The method of claim 3, wherein the transmission of microwave energy is measured at a plurality of second frequencies for at least one of said paths, said second frequencies being in whole number ratio to the first mentioned frequencies.

17. The method of claim 1, wherein comparing said values with one another comprises estimating the mean dielectric constant for at least one area of said sheet consisting of the intersection of a first path selected from the first group and a second path selected from the second group.

18. The method of claim 17, wherein estimating the mean dielectric constant comprises finding the arithmetic average of said values for said first and second paths.

19. The method of claim 17, wherein estimating the mean dielectric constant comprises finding a first variation between the value for the first path and a nominal value, finding a second variation between the value for the second path and said nominal value, finding the average of said first and second variations weighted by the lengths of their respective paths, and adding said average to said nominal value.

20. The method of claim 17, wherein estimating the mean dielectric constant comprises finding the product of the values for said first and second paths.

21. An apparatus for the nondestructive testing of a sheet of dielectric material having opposite faces conductively surfaced and edges of exposed dielectric, comprising:
  a signal generator for producing microwave energy;
  a transmitter connected to receive microwave energy from said signal generator and adapted to radiate said microwave energy as a directional beam, said transmitter being positionable adjacent an edge of the sheet such that said beam enters the sheet at said edge and travels through the sheet along a path in the plane of the sheet;
  a microwave receiver;
  means for positioning the microwave receiver a variable distance from the transmitter, such that the microwave receiver is positionable adjacent an edge of the sheet to receive said beam as its exits from the sheet;
  means for directing a portion of said microwave energy along an air path whose length is in a fixed ratio to the length of the path through the sheet; and
  means for comparing the phase delay of the microwave energy passing through the sheet with the phase delay of the microwave energy passing along the air path.

22. The apparatus of claim 21, wherein said ratio is approximately equal to the square root of the nominal dielectric constant of the sheet.

23. The apparatus of claim 21 or 22, further comprising means for varying the distance between said transmitter and receiver to accommodate sheets of different dimensions, and means for simultaneously varying the length of the air path such that said fixed ratio is maintained.

24. The apparatus of claim 21, wherein said transmitter and receiver comprise metal-clad layers of dielectric material having thicknesses substantially equal to the thickness of the sheet.

25. The apparatus of claim 24, wherein the transmitter and receiver further comprise parabolic reflector surfaces adapted to minimize phase distortion across the width of their respective apertures.

26. The apparatus of claim 25, wherein the apertures of the transmitter and receiver are substantially equal in width, and wherein each of said parabolic reflector surfaces has the shape of an arc of a parabola having a focal length approximately equal to the width of said apertures.

27. The apparatus of claim 26, wherein the width of said apertures is in the range of three times the wavelength of the microwave energy to five times the wavelength of the microwave energy.

* * * * *